US00RE47003E

(19) United States
(12) Reissued Patent
He et al.

(10) Patent Number: US RE47,003 E
(45) Date of Reissued Patent: Aug. 21, 2018

(54) ORGANIC THIN FILM TRANSISTOR WITH ION EXCHANGED GLASS SUBSTRATE

(71) Applicant: Corning Incorporated, Corning, NY (US)

(72) Inventors: Mingqian He, Horseheads, NY (US); Jianfeng Li, Lake St. Louis, MO (US); James Robert Matthews, Painted Post, NY (US); Michael S Pambianchi, Corning, NY (US)

(73) Assignee: Corning Incorporated, Corning, NY (US)

(21) Appl. No.: 15/254,700

(22) Filed: Sep. 1, 2016

Related U.S. Patent Documents

Reissue of:
(64) Patent No.: 8,901,544
Issued: Dec. 2, 2014
Appl. No.: 13/690,314
Filed: Nov. 30, 2012

U.S. Applications:
(60) Provisional application No. 61/567,342, filed on Dec. 6, 2011.

(51) Int. Cl.

| | |
|---|---|
| ***H01L 29/08*** | (2006.01) |
| ***H01L 51/00*** | (2006.01) |
| ***H01L 35/24*** | (2006.01) |
| ***H01L 51/05*** | (2006.01) |

(52) U.S. Cl.
CPC ..... *H01L 51/0508* (2013.01); *H01L 51/0001* (2013.01); *H01L 51/0096* (2013.01); *Y02P 70/521* (2015.11)

(58) Field of Classification Search
CPC ..... H01L 51/0508; H01L 51/0001; H01L 51/0096; Y02P 70/521; Y02E 10/549
See application file for complete search history.

(56) References Cited

U.S. PATENT DOCUMENTS

| | | | | |
|---|---|---|---|---|
| 4,076,921 | A | 2/1978 | Stol et al. | |
| 4,463,164 | A | 7/1984 | Dalton et al. | |
| 6,001,466 | A | 12/1999 | Noguchi et al. | |
| 6,050,870 | A | 4/2000 | Suginoya et al. | |
| 6,353,072 | B1 | 3/2002 | Towns et al. | |
| 6,476,416 | B1 * | 11/2002 | Ikeda | 257/59 |
| 6,881,803 | B2 | 4/2005 | Endo et al. | |

(Continued)

FOREIGN PATENT DOCUMENTS

| | | |
|---|---|---|
| DE | 10 2006 061966 | 6/2008 |
| DE | 102006061966 A1 | 6/2008 |

(Continued)

OTHER PUBLICATIONS

Allard et al. "Organic semiconductors for solution-processable field-effect transistors (OFETs)" U. Angew. Chem. Int. ED. 2008, 47, pp. 4070-4098.

(Continued)

*Primary Examiner* — Elizabeth McKane
(74) *Attorney, Agent, or Firm* — Dinsmore & Shohl LLP

(57) ABSTRACT

Articles utilizing strengthened glass substrates, for example, ion-exchanged glass substrates, in combination with organic molecules or polymers are described along with methods for making the articles. The articles are useful in electronics-based devices that utilize organic thin film transistors.

24 Claims, 5 Drawing Sheets

(56) References Cited

U.S. PATENT DOCUMENTS

| | | | | |
|---|---|---|---|---|
| 7,060,781 | B2 | 6/2006 | Mitsui et al. | |
| 7,282,554 | B2 | 10/2007 | Mitsui et al. | |
| 7,666,511 | B2 | 2/2010 | Ellison et al. | |
| 7,705,108 | B2 | 4/2010 | He | |
| 7,838,623 | B2 | 11/2010 | He et al. | |
| 7,893,191 | B2 | 2/2011 | He | |
| 7,919,634 | B2 | 4/2011 | He et al. | |
| 7,932,344 | B2 | 4/2011 | Li et al. | |
| 8,158,543 | B2 | 4/2012 | Dejneka et al. | |
| 8,187,987 | B2 | 5/2012 | Amin et al. | |
| 8,217,193 | B2 | 7/2012 | Narayan et al. | |
| 8,278,346 | B2 | 10/2012 | He et al. | |
| 8,349,998 | B2 | 1/2013 | He | |
| 8,394,918 | B2 | 3/2013 | He et al. | |
| 8,487,114 | B2 | 7/2013 | He et al. | |
| 8,586,492 | B2 | 11/2013 | Barefoot et al. | |
| 8,707,515 | B2 | 4/2014 | Payne et al. | |
| 8,796,165 | B2 | 8/2014 | Ellison et al. | |
| 8,846,855 | B2 | 9/2014 | He et al. | |
| 8,901,544 | B2 | 12/2014 | He et al. | |
| 8,916,066 | B2 | 12/2014 | He et al. | |
| 8,951,927 | B2 | 2/2015 | Dejneka et al. | |
| 8,969,226 | B2 | 3/2015 | Dejneka et al. | |
| 9,156,724 | B2 | 10/2015 | Gross | |
| 9,290,413 | B2 | 3/2016 | Dejneka et al. | |
| 9,346,703 | B2 | 5/2016 | Bookbinder et al. | |
| 9,517,967 | B2 | 12/2016 | Dejneka et al. | |
| 2005/0070685 | A1 | 3/2005 | Mitsui et al. | |
| 2008/0135891 | A1* | 6/2008 | Arias | H01L 29/4908 257/288 |
| 2009/0002821 | A1 | 1/2009 | Okano et al. | |
| 2009/0065878 | A1 | 3/2009 | Li et al. | |
| 2009/0197048 | A1 | 8/2009 | Amin et al. | |
| 2010/0047521 | A1* | 2/2010 | Amin et al. | 428/141 |
| 2010/0305288 | A1* | 12/2010 | He | C07D 495/22 526/256 |
| 2011/0017287 | A1 | 1/2011 | Borrelli et al. | |
| 2011/0017956 | A1 | 1/2011 | Hou et al. | |
| 2011/0105717 | A1 | 5/2011 | Rauscher et al. | |
| 2011/0129665 | A1 | 6/2011 | Botelho et al. | |
| 2011/0240064 | A1 | 10/2011 | Wales et al. | |
| 2011/0267697 | A1 | 11/2011 | Kohli et al. | |
| 2012/0280373 | A1 | 11/2012 | Feng et al. | |
| 2013/0085256 | A1 | 4/2013 | He et al. | |
| 2015/0045560 | A1 | 2/2015 | He et al. | |

FOREIGN PATENT DOCUMENTS

| | | | | |
|---|---|---|---|---|
| EP | 2 169 007 | | 3/2010 | |
| EP | 2169007 | A1 | 3/2010 | |
| WO | 2006031893 | | 3/2006 | |
| WO | 2006031893 | A2 | 3/2006 | |
| WO | 2008106019 | | 9/2008 | |
| WO | 2008106019 | A2 | 9/2008 | |
| WO | 2009123695 | | 10/2009 | |
| WO | 2009123695 | A1 | 10/2009 | |
| WO | WO 2010119243 | A1 * | 10/2010 | H01L 51/0012 |
| WO | 2010136385 | A1 | 12/2010 | |

OTHER PUBLICATIONS

He et al. "Alkylsubstituted thienothiophene semiconducting materials: structure-property relationships" J. Am. Chem. Soc. 2009, 131, 11930-11938.

Katz, H. E. "Recent advances in semiconductor performance and printing processes for organic transistor-based electronics" Chem. Mater. 2004, 16, 4748-4756.

Lo et al. "Flexible glass substrates for organic TFT active matrix electrophoretic displays" Digest of Technical Papers—Society for Information Display International Symposium (2011), 42(Bk. 1), 387-388.

Siringhaus et al. "Two-dimensional charge transport in self-organized, high-mobility conjugated polymers" Nature 1999, 401, 685-688.

He, M. et al., Synthesis and Structure of Alkyl-Substitute Fused Thiophenes Containing up to Seven Rings; J. Org. Chem. 2007, 2, 444.

Fong, H.H. et al. Tetrathienoacene Copolymers as High Mobility, Soluble Organic Semiconductors; J. Am. Chem. Soc. 2008, 130, 13202.

Bronstein, H. et al. Thieno [3,2-b] thiophene—Diketopryrrolopyrrole-Containing Polymers for High-performance Organic Field-Effect Transistors and Organic Photovoltaic Devices; J. Am. Chem. Soc. 2011, 133, 3272.

Li, Y., A High Mobility P-Type DPP-Thieno [3,2-b] thiophene Copolymer for Organic Thn-Film Transistors; Adv. Mater. 2010, 22, 4862-4866.

He et al., "Importance of C2 Symmetry for the Device Performance of a Newly Synthesized Family of Fused-Ring Thiophenes"; Chemistry of Materials, American Chemical Society, vol. 22, No. 9, Sep. 1, 2010, pp. 2770-2779.

PCT Search Report and Written Opinion dated Jul. 3, 2012, in corresponding PCT Application Serial No. PCT/US2012/025856.

Toth, Z., et al., "Investigation of Indentation-Caused Cracking in Surface-Modified Silica Glasses," Materials Science and Engineering A; Structural Materials: Properties, Microstructure & Processing, Lausanne, CH, vol. 387-389, Dec. 15, 2004.

Tieke, B., Conjugated Polymers Containing Diketopyrrolopyrrole Units in the Main Chain; Beilstein J. Org. Chem. 2010, 6, 830.

Aert et al.; "Controlled Molecular Weight by the Precipitation Polymerization of 2, 6-dimethylphenol", Journal of Macromolecular Science, Part A—Pure and Applied Chemistry, vol. 32, No. 3, Jan. 1, 1995, pp. 515-523.

* cited by examiner

ORGANIC THIN FILM TRANSISTOR WITH ION EXCHANGED GLASS SUBSTRATE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

This application claims the benefit of priority under 35 USC §119 of U.S. Provisional Application Ser. No. 61/567,342 filed Dec. 6, 2011 the content of which is relied upon and incorporated herein by reference in its entirety.

FIELD

Embodiments generally relate to articles using strengthened glass as a substrate and more particularly to using strengthened glass in combination with organic molecules or polymers as a substrate for electronics devices, such as thin film transistors, and methods for making the articles.

TECHNICAL BACKGROUND

As portable electronics devices, such as e-readers, video displays, and other gadgetry continue to gain worldwide acceptance, the demand for improved mechanical durability in these devices grows. Many of these devices contain thin film transistors, most often comprising glass support substrates. For those products using glass as the backplane substrate, an impact with the floor, harsh environmental conditions, or similar event could cause device failure. For example, fracturing of the glass backplane substrate is a dominant failure mode in current e-readers.

Glass is viewed by device manufacturers as limiting the device durability, and attempts have been made to replace it with other materials such as metal sheets (e.g. aluminum or stainless steel) and polymer films (polyethylene terephthalate or polyethylene naphthalate). Although metal and polymer films are non-brittle, these materials also have limitations. Metal films are often too rough and require a planarization layer and polymer films are prone to solvent incompatibility and have thermal-dimensional limitations. Additionally, metal and polymer substrates may provide additional compatibility issues not present with glass when used as a support substrate.

The ideal substrate would be able to withstand increased temperatures, provide a surface with low roughness, be unaffected by processing solvents, and be able to withstand everyday final product-type abuse. Current substrates fail to meet at least one of these important factors, leading to an unmet need to find novel substrates that have improved performance.

SUMMARY

Fabrication of active electronic structures on ion-exchanged glass will enable strong, nearly unbreakable glass to be used as the electronic backplane in electronic devices such as liquid crystal displays. If the electronic backplanes were composed of ion-exchanged glass, much of this extra hardware could be eliminated, and new, frameless devices could be developed, with potential for greatly improved aesthetics, lighter weight, lower manufacturing costs, and/or improved product durability. If the active electronics on ion-exchanged glass are also composed of optically transparent materials, then this would enable transparent, all-glass electronic devices.

One possibility is to use strengthened glass, such as Gorilla® (registered Trademark of Corning Incorporated) Glass as the backplane substrate. Ion-exchanged Gorilla® Glass, however, is sodium and potassium rich on the surface and alkali metal is a disadvantage in semiconductor device operation and fabrication, for example, TFT manufacturing. Free alkali metal ions can contaminate typical TFT devices, such as silicon (Si) TFTs, and alkali containing glass is to be avoided in the typical high temperature vacuum processing steps used to make inorganic TFTs may allow transfer of alkali metal ions into the active semi-conductor, which is detrimental to performance. Traditionally, alkali-free glass has been used in TFTs as it will not contaminate the silicon, but alkali-free glass does not have the mechanical reliability of ion-exchanged glass.

Another possibility is the use of more traditional glasses that are thermally or chemically hardened, such as soda-lime glass that has been tempered. However, soda-lime glasses have high levels of alkali metals as well and therefore use of these materials may also result in contamination of TFT devices.

It has now unexpectedly been discovered that semiconductor devices, for example, organic TFTs can be directly fabricated onto a mechanically durable strengthened glass, for example, an ion-exchanged substrate, with no barrier layer present. Embodiments described herein may provide one or more of the following advantages: provide a practical way to fabricate organic TFTs and circuits on strengthened glass, including ion-exchanged and tempered glass substrates; provide a means of using strengthened glass, for example, ion-exchanged or tempered glass as suitable substrates for display backplanes; allow the fabrication of electronic devices on strengthened glass, for example, ion-exchanged or tempered glasses without changing the superior compression strength of the glass; and/or provide an improved method with decreased cost since the removal of the barrier layer allows for a thinner device with less production steps.

A first embodiment comprises an article comprising: a strengthened glass substrate having a first surface and a second surface and having a Vickers crack initiation threshold of at least 7 kgf; an organic semiconductor layer having a first surface and a second surface; a dielectric layer having a first surface and a second surface; and at least one electrode; wherein the article does not contain a barrier layer. In some embodiments, the at least one electrode comprises a gate electrode, a drain electrode, and a source electrode. In some embodiments, the at least one electrode comprises a metal, conducting metal oxide film, conducting metal nanoparticulate ink, or conductive polymer. In some embodiments, the organic semiconductor layer comprises a semiconducting small molecule, semiconducting oligomer, or semiconducting polymer. In some embodiments, the dielectric layer comprises an organic or inorganic material that may be applied as a film at a temperature less than about 250° C. In some embodiments, the strengthened glass comprises an ion-exchanged glass. In some embodiments, the strengthened glass comprises tempered glass. In some embodiments, the glass is an aluminoborosilicate, alkalialuminoborosilicate, aluminosilicate, alkalialuminosilicate, or soda lime glass. In some embodiments, the article comprises a thin film transistor, photovoltaic device, diode, or display device.

In some embodiments, the article further comprises a functional layer on the surface opposite of the organic semiconductor layer and dielectric layer of the strengthened glass substrate, wherein the functional layer is selected from an anti-glare layer, an anti-smudge layer, a self-cleaning layer, an anti-reflection layer, an anti-fingerprint layer, an optically scattering layer, anti-splintering, and combinations thereof.

Another embodiment comprises a thin film transistor comprising: a strengthened glass substrate having a first surface and a second surface and having a Vickers crack initiation threshold of at least 7 kgf; an organic semiconductor layer having a first surface and a second surface; a dielectric layer having a first surface and a second surface; and at least one electrode; wherein the article does not contain a barrier layer. In some embodiments, the at least one electrode comprises a gate electrode, a drain electrode, and a source electrode. In some embodiments, the at least on electrode comprises a metal, conducting metal oxide film, conducting metal nanoparticulate ink, or conductive polymer. In some embodiments, the organic semiconductor layer comprises a semiconducting small molecule, semiconducting oligomer, or semiconducting polymer. In some embodiments, the dielectric layer comprises an organic or inorganic material that may be applied as a film at a temperature less than about 250° C. In some embodiments, the strengthened glass comprises an ion-exchanged glass.

In some embodiments, the thin film transistor further comprises a functional layer on the surface opposite of the organic semiconductor layer and dielectric layer of the strengthened glass substrate, wherein the functional layer is selected from an anti-glare layer, an anti-smudge layer, a self-cleaning layer, an anti-reflection layer, an anti-fingerprint layer, an optically scattering layer, an anti-splintering layer, and combinations thereof.

In some embodiments, the thin film transistor comprises a bottom-gate top-contact design. In some embodiments, the thin film transistor comprises a bottom-gate bottom-contact design. In some embodiments, the thin film transistor comprises a top-gate top-contact design. In some embodiments, the thin film transistor comprises a top-gate bottom-contact design.

Another embodiment comprises a method of forming an article comprising: providing a strengthened glass substrate having a first surface and a second surface and having a Vickers crack initiation threshold of at least 7 kgf; providing an organic semiconductor layer; providing a dielectric layer; and providing at least one electrode; wherein the article does not contain a barrier layer. In some embodiments, the providing an organic semiconductor layer comprises coating the strengthened glass substrate with the organic semiconductor layer and coating the organic semiconductor layer with the dielectric layer. In some embodiments, the providing a dielectric layer comprises coating the strengthened glass substrate with the dielectric layer and coating the dielectric layer with the organic semiconductor layer.

In some embodiments, coating comprises spin casting, doctor blading, dip-coating, drop casting or various printing methods, such as ink jet printing, slot die printing and gravure printing.

BRIEF DESCRIPTION OF THE DRAWINGS

FIG. 8 shows the synthesis of two possible organic semiconductor polymers that may be used in embodiments.

DETAILED DESCRIPTION

Figure 1:
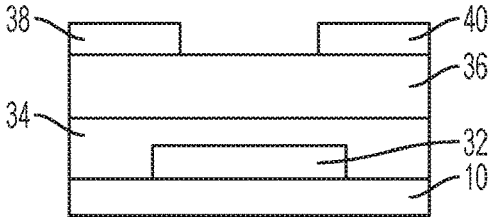
FIG. 1 is a side view illustration of a bottom-gate top-contact (BG-TC) transistor based device wherein 38 is the drain electrode, 40 is the source electrode, 32 is the gate electrode, 34 is the dielectric layer, 10 is the ion-exchanged glass substrate, and 36 is the organic semiconductor layer.

The present embodiments can be understood more readily by reference to the following detailed description, drawings, examples, and claims, and their previous and following description. However, before the present compositions, articles, devices, and methods are disclosed and described, it is to be understood that this description is not limited to the specific compositions, articles, devices, and methods disclosed unless otherwise specified, as such can, of course, vary. It is also to be understood that the terminology used herein is for the purpose of describing particular aspects only and is not intended to be limiting.

The following description is provided as an enabling teaching. To this end, those skilled in the relevant art will recognize and appreciate that many changes can be made to the various embodiments described herein, while still obtaining the beneficial results. It will also be apparent that some of the desired benefits can be obtained by selecting some of the features without utilizing other features. Accordingly, those who work in the art will recognize that many modifications and adaptations to the present embodiments are possible and can even be desirable in certain circumstances and are a part of the present description. Thus, the following description is provided as illustrative and should not be construed as limiting.

Disclosed are materials, compounds, compositions, and components that can be used for, can be used in conjunction with, can be used in preparation for, or are embodiments of the disclosed method and compositions. These and other materials are disclosed herein, and it is understood that when combinations, subsets, interactions, groups, etc. of these materials are disclosed that while specific reference of each various individual and collective combinations and permutation of these compounds may not be explicitly disclosed, each is specifically contemplated and described herein. Thus, if a class of substituents A, B, and C are disclosed as well as a class of substituents D, E, and F, and an example of a combination embodiment, A-D is disclosed, then each is individually and collectively contemplated. Thus, in this example, each of the combinations A-E, A-F, B-D, B-E, B-F, C-D, C-E, and C-F are specifically contemplated and should be considered disclosed from disclosure of A, B, and C; D, E, and F; and the example combination A-D. Likewise, any subset or combination of these is also specifically contemplated and disclosed. Thus, for example, the sub-group of A-E, B-F, and C-E are specifically contemplated and should be considered disclosed from disclosure of A, B, and C; D, E, and F; and the example combination A-D. This concept applies to all aspects of this disclosure including, but not limited to any components of the compositions and steps in methods of making and using the disclosed compositions. Thus, if there are a variety of additional steps that can be performed it is understood that each of these additional steps can be performed with any specific embodiment or combination of embodiments of the disclosed methods, and that each such combination is specifically contemplated and should be considered disclosed.

In this specification and in the claims which follow, reference will be made to a number of terms which shall be defined to have the meanings detailed herein.

"Include," "includes," or like terms means encompassing but not limited to, that is, inclusive and not exclusive.

The term "about" references all terms in the range unless otherwise stated. For example, about 1, 2, or 3 is equivalent to about 1, about 2, or about 3, and further comprises from about 1-3, from about 1-2, and from about 2-3. Specific and preferred values disclosed for compositions, components, ingredients, additives, and like aspects, and ranges thereof, are for illustration only; they do not exclude other defined values or other values within defined ranges. The compositions and methods of the disclosure include those having any value or any combination of the values, specific values, more specific values, and preferred values described herein.

The indefinite article "a" or "an" and its corresponding definite article "the" as used herein means at least one, or one or more, unless specified otherwise As used herein, the term "substrate" can be used to describe either a substrate or a superstrate depending on the configuration of the device. For example, the substrate is a superstrate, if when assembled into, for example, a photovoltaic cell, it is on the light incident side of a photovoltaic cell. The superstrate can provide protection for the photovoltaic materials from impact and environmental degradation while allowing transmission of the appropriate wavelengths of the solar spectrum. Further, multiple photovoltaic cells can be arranged into a photovoltaic module. Photovoltaic device can describe a cell, a module, or both.

As used herein, the term "adjacent" can be defined as being in close proximity. Adjacent structures may or may not be in physical contact with each other. Adjacent structures can have other layers and/or structures disposed between them.

In a first aspect, embodiments comprise an article comprising: a strengthened glass substrate having a first surface and a second surface and having a Vickers crack initiation threshold of at least 7 kgf; an organic semiconductor layer having a first surface and a second surface; a dielectric layer having a first surface and a second surface; and at least one electrode; wherein the article does not contain a barrier layer.

In some embodiments, the strengthened glass substrate comprises a glass substrate that has been mechanically, thermally, or chemically modified to increase the strength of the glass.

In one embodiment, the strengthened glass substrate is an ion-exchanged glass substrate. Ion-exchange is widely used to chemically strengthen glass articles for such applications. In this process, a glass article containing a first metal ion (e.g., alkali cations in $Li_2O$, $Na_2O$, etc.) is at least partially immersed in or otherwise contacted with an ion-exchange bath or medium containing a second metal ion that is either larger or smaller than the first metal ion that is present in the glass. The first metal ions diffuse from the glass surface into the ion-exchange bath/medium while the second metal ions from the ion-exchange bath/medium replace the first metal ions in the glass to a depth of layer below the surface of the glass. The substitution of larger ions for smaller ions in the glass creates a compressive stress at the glass surface, whereas substitution of smaller ions for larger ions in the glass typically creates a tensile stress at the surface of the glass. In some embodiments, the first metal ion and second metal ion are monovalent alkali metal ions. However, other monovalent metal ions such as $Ag^+$, $Tl^+$, $Cu^+$, and the like may also be used in the ion-exchange process.

In one embodiment, the strengthened glass substrate comprises a strengthened glass wherein the glass is ion-exchanged to a depth of layer of at least 20 μm from a surface of the glass. In another embodiment, the strengthened glass substrates described herein, when chemically strengthened by ion-exchange, exhibit a Vickers initiation cracking threshold of at least about 5 kgf (kilogram force), in some embodiments, at least about 5, 6, 7, 8, 9, 10, 11, 12, 13, 14, 15, 16, 17, 18, 19, or 20 kgf. In some embodiments, the strengthened glass substrates described herein, when chemically strengthened by ion-exchange, exhibit a Vickers initiation cracking threshold of from about 5 kgf to about 50 kgf, about 5 kgf to about 40 kgf, about 5 kgf to about 30 kgf, about 5 kgf to about 20 kgf, about 7 kgf to about 50 kgf, about 7 kgf to about 40 kgf, about 7 kgf to about 30 kgf, about 7 kgf to about 20 kgf, about 10 kgf to about 50 kgf, about 10 kgf to about 40 kgf, or about 10 kgf to about 30 kgf.

In some embodiments, the strengthened glass substrate comprises an alkali containing glass. In some embodiments, the strengthened glass substrate comprises an aluminoborosilicate, an alkalialuminoborosilicate, an aluminosilicate, an alkalialuminosilicate, or a soda lime glass. In some embodiments, the glass comprises an ion exchanged glass as described in U.S. Prov. Appl. Nos. 61/560,434, 61/653,489, and 61/653,485, and U.S. application Ser. Nos. 12/858,490, 12/277,573, 13/588,581, 11/888,213, 13/403,756, 12/392,577, 13/346,235, 13/495,355, 12/858,490, 13/533,298, 13/291,533, and 13/305,271, all of which are hereby incorporated by reference in their entirety.

According to some embodiments, the strengthened glass substrate has a thickness of 4.0 mm or less, for example, 3.5 mm or less, for example, 3.2 mm or less, for example, 3.0 mm or less, for example, 2.5 mm or less, for example, 2.0 mm or less, for example, 1.9 mm or less, for example, 1.8 mm or less, for example, 1.5 mm or less, for example, 1.1 mm or less, for example, about 0.05 mm to about 2.0 mm, for example, about 0.05 mm to about 1.1 mm, for example, about 0.1 mm to about 1.1 mm. Although these are exemplary thicknesses, the strengthened glass substrate can have a thickness of any numerical value including decimal places in the range of from about 0.040 mm up to and including 4.0 mm.

In some embodiments, the organic semiconductor layer comprises semiconducting small molecules, oligomers and/or polymers. Semiconducting small molecules include the polycyclic aromatic compounds, such as pentacene, anthracene, and rubrene and other conjugated aromatic hydrocarbons. Polymeric organic semiconductors include, for example, poly(3-hexylthiophene), poly(p-phenylene vinylene), as well as polyacetylene and its derivatives. Generally speaking, there are two major overlapping classes of organic semiconductors—organic charge-transfer complexes and various linear-backbone conductive polymers derived from polyacetylene and similar compounds, such as polypyrrole, and polyaniline. However, embodiments are not limited in scope to only these types of organic semiconductors, and, as shown in the examples, are capable of working with a broad range of organic semiconductors.

In some embodiments, the organic semiconductor layer comprises a fused thiophene compound. In some embodiments, the fused thiophene is incorporated into a polymer. Fused thiophenes and fused thiophene polymers may comprise compounds as described in U.S. Pat. Nos. 7,705,108, 7,838,623, 7,893,191, 7,919,634, 8,217,183, 8,278,346, U.S. application Ser. Nos. 12/905,667, 12/907,453, 12/935,426, 13/093,279, 13/036,269, 13/660,637, 13/660,529, and U.S. Prov. Appl. Nos. 61/617,202, and 61/693,448, all herein incorporated by reference in their entireties.

Figure 7A:
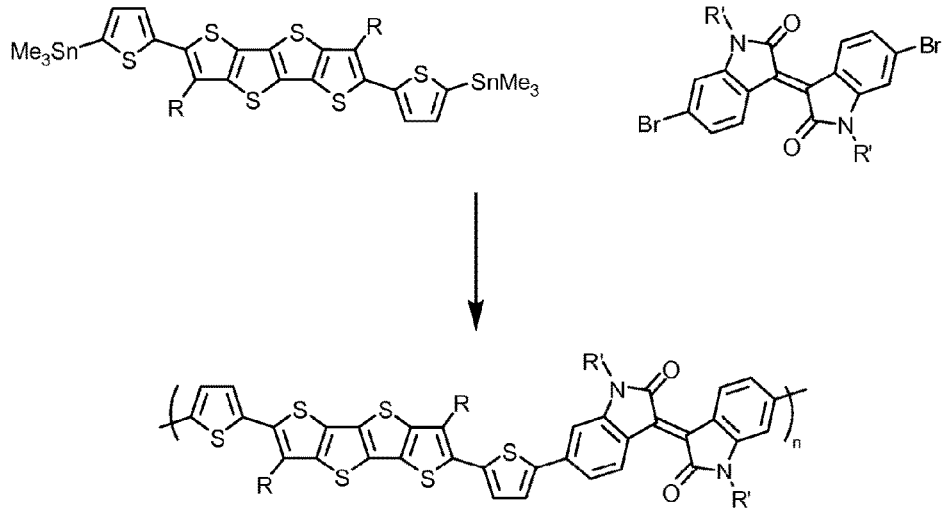
FIG. 7A describes the synthesis of a fused thiophene-iosindigo polymer and FIG. 7B describes the synthesis of a stilbene-fused thiophene polymer.
Figure 7B:
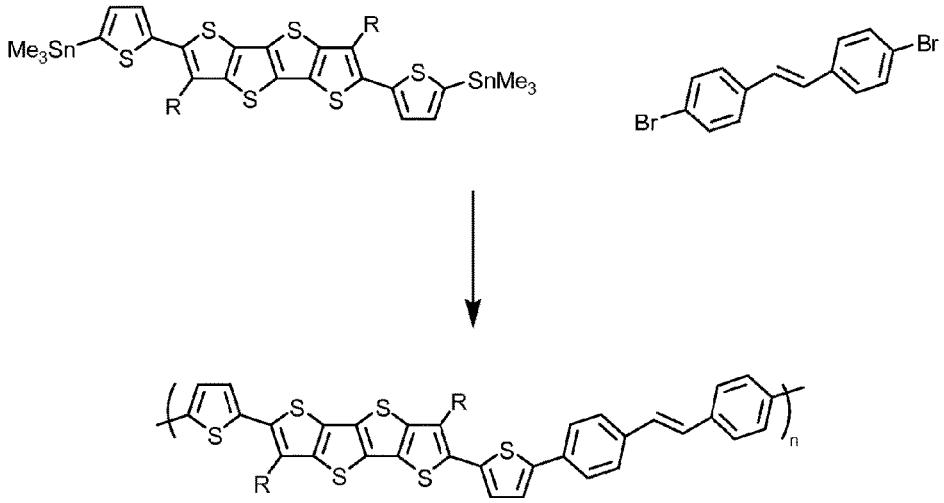
FIG. 7 shows the synthesis of two possible organic semiconductor polymers that may be used in embodiments.
Figure 8A:
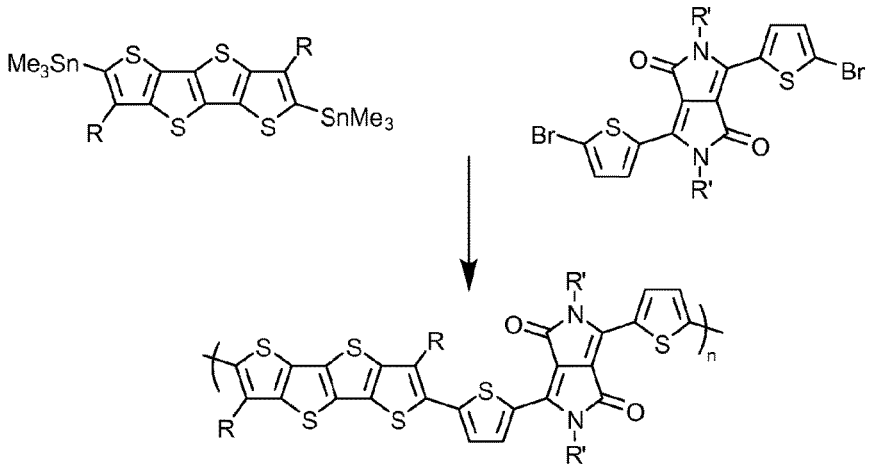
FIG. 8A describes the synthesis of a fused thiophene-diketopyrrolopyrrole polymer and FIG. 8B describes the synthesis of a bithiophene-fused thiophene polymer. Where R=n-heptadecyl
Figure 8B:
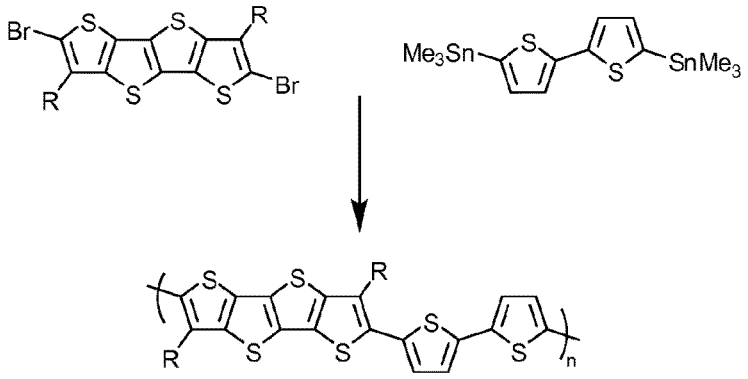
FIG. 8B shows the synthesis of P2TDC17FT4.

Particular examples of fused thiophene compounds that may be used include, but are not limited to, poly[(3,7-diheptadecylthieno[3,2-b]thieno[2',3':4,5]thieno[2,3-d]thiophene-2,6-diyl)(2,2'-bithiophene)-5,5'-diyl], poly[(3,7-diheptadecylthieno[3,2-b]thieno[2',3':4,5]thieno[2,3-d] thiophene-2,6-diyl)(2,5-dihexadecyl-3,6-di(thiophen-2-yl) pyrrolo[3,4-c]pyrrole-1,4(2H,5H)-dione)-5,5'-diyl], poly-3,6-dihexylthieno[3,2-b]thiophene (PDC6FT2), poly-3,6-didecanylthieno[3,2-b]thiophene, poly[(3,7-diheptadecylthieno[3.2-b]thieno[2',3':4,5]thieno[2,3-d] thiophene-2,6-diyl)(1-hexadecyl-3-(1-hexadecyl-2-oxoindol-3-ylidene)indol-2-one-6,6'-diyl)], and poly[(3,7-diheptadecylthieno[3.2-b]thieno[2',3':4,5]thieno[2,3-d] thiophene-2,6-diyl)(stilbene-1,4'-diyl)]. Additional examples of fused thiophene-based polymers are described in FIG. 7 and FIG. 8, wherein FIG. 7A shows a fused thiophene-iosindigo polymer and FIG. 7B describes a fused thiophene-stilbene polymer. Similarly, FIG. 8A shows a fused thiophene-diketopyrrolopyrrole polymer and FIG. 8B shows a bithiophene-fused thiophene polymer.

In some embodiments, the organic semiconductor layer may comprise one or more electroluminescent organic compounds. In some embodiments, the semiconducting small molecules, oligomers and/or polymers of the semiconductor layer may comprise electroluminescent organic compounds.

In some embodiments, the organic semiconductor layer is formed by such processes as dip coating, spin coating, Langmuir-Blodgett deposition, electrospray ionization, direct nanoparticle deposition, vapor deposition, chemical deposition, spray deposition, screen printing, nano-imprint lithography, gravure printing, doctor blading, spray-coating, slot die coating, ink jet printing, laser deposition, drop casting or chemical etching.

In some embodiments, the dielectric layer comprises any organic or inorganic material that is able to be applied as a film at or below 200° C. Examples of dielectrics that may be used in embodiments include polymers, glasses, and inorganic or organic materials. The dielectric layer may be formed by, for example, such processes as sputter coating, atomic layer deposition, dip coating, spin coating, Langmuir-Blodgett deposition, electrospray ionization, direct nanoparticle deposition, vapor deposition, chemical deposition, vacuum filtration, flame spray, electrospray, spray deposition, electrodeposition, screen printing, close space sublimation, nano-imprint lithography, in situ growth, microwave assisted chemical vapor deposition, laser ablation, arc discharge, gravure printing, doctor blading, spray-coating, slot die coating, or chemical etching.

In some embodiments, the electrode comprises gate, drain, and source electrodes. Electrodes can comprise any conducting material—including for example, metals, conducting semi-metals, or conducting non-metals. For example, in some embodiments, an electrode may comprise a metal or combination of metals in the form of a coating, wire, sheet, ribbon, micro- or nanoparticle, or mesh. Electrodes may be formed via such processes as sputter coating, atomic layer deposition, dip coating, spin coating, Langmuir-Blodgett deposition, electrospray ionization, direct nanoparticle deposition, vapor deposition, chemical deposition, vacuum filtration, flame spray, electrospray, spray deposition, electrodeposition, screen printing, close space sublimation, nano-imprint lithography, in situ growth, microwave assisted chemical vapor deposition, laser ablation, arc discharge, gravure printing, doctor blading, spray-coating, slot die coating, or chemical etching.

Embodiments do not include a barrier layer. As used herein, a barrier layer consists of a material positioned between the strengthened glass substrate and the organic semiconductor layer or the source electrode that prevents ion migration. In some embodiments, for example BG-TC and BG-BC type transistors, there may exist a dielectric layer between the organic semiconductor layer and the ion exchanged glass substrate, but no barrier layer between the gate electrode and the ion exchanged glass substrate. In some embodiments, for example TG-TC and TG-BC type transistors, there is no barrier layer or dielectric layer between the organic semiconductor layer and the ion exchanged glass substrate. Traditionally, aluminum oxide and silicon nitride have been used as barrier layers in thin film transistors and other electronic devices.

In some embodiments, the article further comprises an anti-glare layer, an anti-smudge layer, a self-cleaning layer, an anti-reflection layer, an anti-fingerprint layer, an optically scattering layer, an anti-splintering layer, and combinations thereof. Such layers may be incorporated through any number of known processes, such as those disclosed in U.S. Patent Publ. Nos. 2011/0129665, 2009/0197048, 2009/0002821, 2011/0267697, 2011/0017287, or 2011/0240064, herein incorporated by reference.

In another aspect, an embodiment of an article is an organic thin film transistor. An organic TFT device can include: an ion-exchanged glass substrate including the barrier layer. On the barrier layer a gate electrode, a dielectric layer, a drain electrode, a source electrode, and an organic semiconducting channel layer can be formed. These layers can be stacked in different sequences to form a laterally or vertically configured transistor device. The organic semiconducting channel layer includes semiconducting small molecules, oligomers and/or polymers. The dielectric layer can be composed of any organic or inorganic material that is able to be applied as a film at or below 200° C. In this way, a mechanically durable backplane is produced.

FIGS. 1-4 illustrate embodiments of articles comprising TFT devices. As used herein, the term "bottom-gate top-contact transistor" refers to a TFT device comprising an exemplary structure as shown in FIG. 1. A gate electrode 32 is deposited on a strengthened glass substrate, or ion-exchanged glass substrate 10 (according to any of the previously described embodiments) followed by a dielectric layer 34 and then a semiconducting layer 36. Drain and source electrodes 38 and 40, respectively, are further deposited on top of the semiconducting layer 36.

Figure 2:
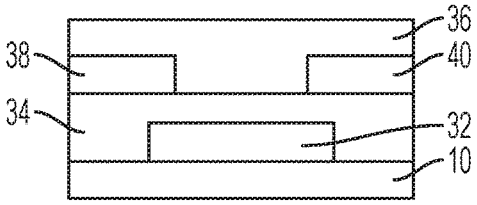
FIG. 2 is a side view illustration of a bottom-gate bottom-contact (BG-BC) transistor based device wherein 38 is the drain electrode, 40 is the source electrode, 32 is the gate electrode, 34 is the dielectric layer, 10 is the ion-exchanged glass substrate, and 36 is the organic semiconductor layer.

The term "bottom-gate bottom-contact transistor" refers to a TFT device comprising an exemplary structure as shown in FIG. 2. A gate electrode 32 is deposited on a strengthened glass substrate, or ion-exchanged glass substrate 10 followed by a dielectric layer 34 and then drain and source electrodes 38 and 40, respectively. A semiconducting layer 36 is further deposited on top of these underlying layers.

Figure 3:
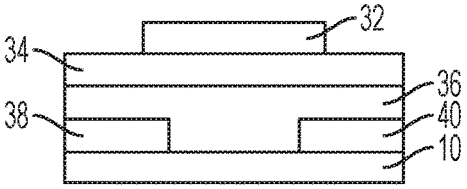
FIG. 3 is a side view illustration of a top-gate bottom-contact (TG-BC) transistor based device wherein 38 is the drain electrode, 40 is the source electrode, 32 is the gate electrode, 34 is the dielectric layer, 10 is the ion-exchanged glass substrate, and 36 is the organic semiconductor layer.
Figure 4:
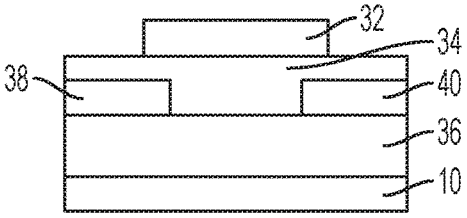
FIG. 4 is a side view illustration of a top-gate top-contact (TG-TC) transistor based device wherein 38 is the drain electrode, 40 is the source electrode, 32 is the gate electrode, 34 is the dielectric layer, 10 is the ion-exchanged glass substrate, and 36 is the organic semiconductor layer.

The term "top-gate bottom-contact transistor" refers to a TFT device comprising an exemplary structure as shown in FIG. 3. Drain and source electrodes 38 and 40, respectively are deposited on a strengthened glass or ion-exchanged glass substrate 10 (according to any of the previously described embodiments). A semiconducting layer 36 is then deposited on top, followed by a dielectric layer 34 and then a gate electrode 32.

Figure 6:
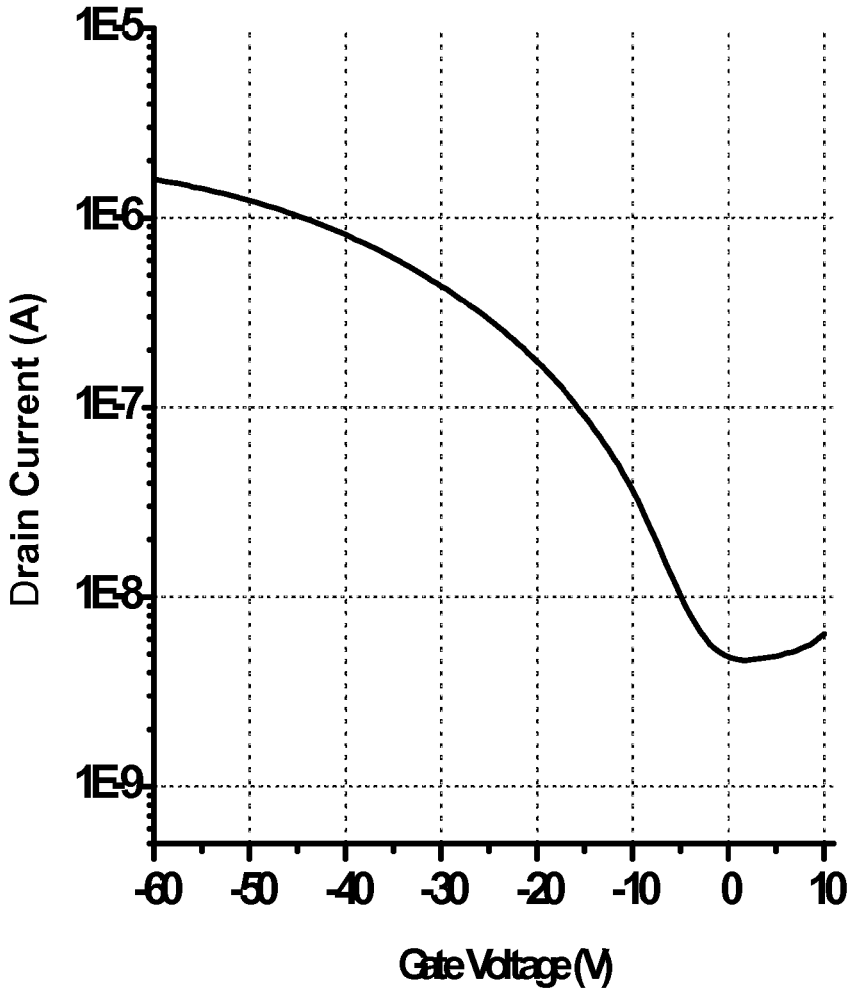
FIG. 6 is a transfer curve of a TG-TC organic TFT comprising poly[(3,7-diheptadecylthieno[3,2-b]thieno[2',3':4,5]thieno[2,3-d]thiophene-2,6-diyl)(2,2'-bithiophene-5,5'-diyl)] (P2TDC17FT4) organic semiconductor in contact with the ion exchange glass substrate. The dielectric layer is a PVP-co-PMMA polymer. The measured transfer curve of the device reveals a field effect hole mobility of 0.02 $cm^2/V\cdot s$, an on/off ratio of 700, and a threshold voltage of 5 V.

The term "top-gate top-contact transistor" refers to a TFT device comprising an exemplary structure as shown in FIG. 6. A semiconducting layer 36 is deposited on a strengthened glass substrate, or ion-exchanged glass substrate 10 followed by drain and source electrodes 38 and 40, respectively. A dielectric layer 34 is further deposited on top, followed by a gate electrode 32.

Another aspect comprises methods of forming embodiments, comprising: providing a strengthened glass substrate having a first surface and a second surface and having a Vickers crack initiation threshold of at least 20 kgf; providing an organic semiconductor layer; providing a dielectric layer; and providing at least one electrode; wherein the article does not contain a barrier layer. As noted above, it is possible via a number of processes, all incorporated herein, to provide the various elements described. In some embodiments, providing an organic semiconductor layer comprises coating the strengthened glass substrate with the organic semiconductor layer and coating the organic semiconductor layer with the dielectric layer. In some embodiments, providing a dielectric layer comprises coating the strengthened glass substrate with the dielectric layer and coating the dielectric layer with the organic semiconductor layer.

EXAMPLES

Example 1

Figure 5:
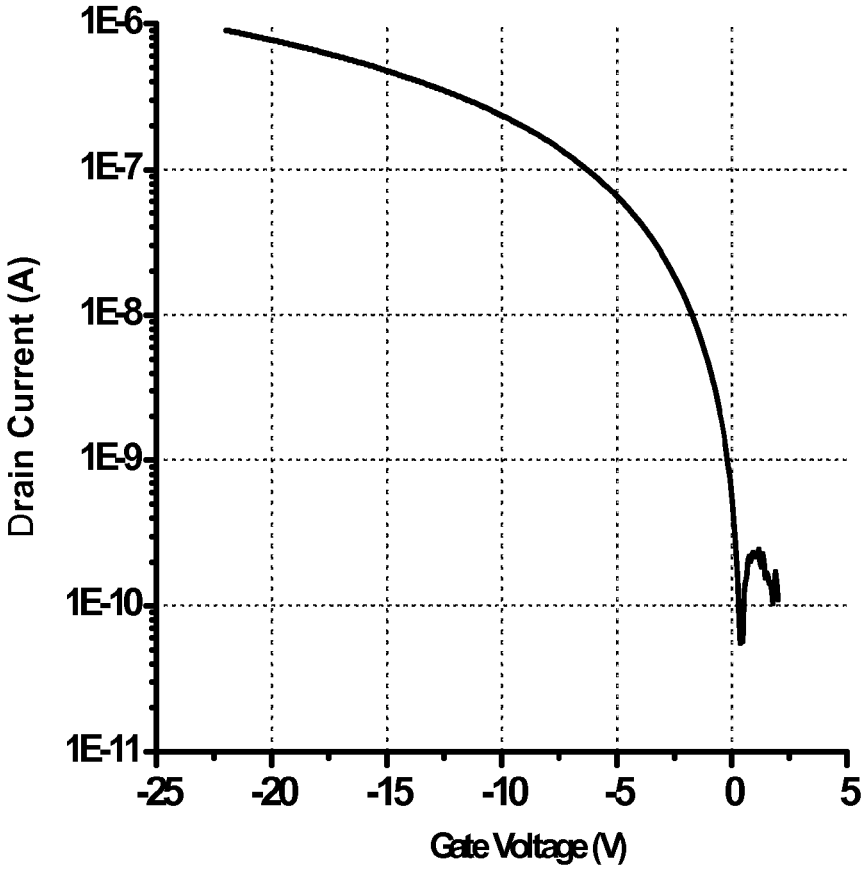
FIG. 5 is a transfer curve of a fabricated BG-TC organic TFT comprising a thiophene copolymer poly[(3,7-diheptadecylthieno[3,2-b]thieno[2',3':4,5]thieno[2,3-d]thiophene-2,6-diyl)(2,2'-bithiophene-5,5'-diyl)] (P2TDC17FT4) on a polymer dielectric layer. Based on the curve, it was determined that the field-effect hole mobility of the device was 0.03 $cm^2V\cdot s$, the on/off ration was $5\times10^3-1\times10^4$, and the threshold voltage was −2.5 V.

Organic Bottom-Gate, Top-Contact Thin Film Transistors on Ion Exchange Glass Ion exchanged glass substrates were cleaned by using sonication in acetone and then isopropanol. The 30 nm thick Au gate electrode was deposited on the substrate by thermal evaporation of Au at 2 Å/s. The dielectric comprised a mixture of 11 wt % (film thickness approximately 800 nm-1 μm) PVP solution in PGMEA and melamine, which was spin-cast onto the substrate at 1000 rpm for 30 seconds. This dielectric was cured via UV irradiation for approximately 3 minutes. Then, 3 mg/mL of a semiconducting polymer Poly[(3,7-diheptadecylthieno[3,2-b]thieno[2,3':4,5]thieno[2,3-d]thiophene-2,6-diyl)(2,2'-bithiophene)-5,5'-diyl] (P2TDC17FT4) dissolved in 1,2-dichlorobenzene was spin-coated onto the substrate. The device was annealed at 100° C. for 30 minutes on a hotplate. Finally, 30 nm thick Au source and drain electrodes were deposited by thermal evaporation of Au at 2 Å/s. The transfer curve (FIG. 5) of fabricated organic TFT device reveals a field-effect hole mobility of 0.03 $cm^2/V\cdot s$, an on/off ratio of $5\times10^3$-$1\times10^4$, and a threshold voltage of −2.5 V.

Example 2

Organic Top-Gate, Top-Contact Thin Film Transistors on Ion Exchange Glass

Ion exchanged glass was cleaned by deionized water, followed by sonication in toluene, and then acetone, and 2-propanol. Glass substrates were then placed in a UV-Ozone cleaner for 10 mins and subsequently exposed to a surface treatment of octyltrichlorosilane vapor for 30 minutes. The organic semiconductor Poly[(3,7-diheptadecylthieno[3,2-b]thieno[2',3':4,5]thieno[2,3-d]thiophene-2,6-diyl)(2,5-dihexadecyl-3,6-di(thiophen-2-yl)pyrrolo[3,4-c]pyrrole-1,4(2H,5H)-dione)-5,5'-diyl] (PTDC16DPPTDC17FT4) was spin cast onto the cleaned substrates at 1000 rpm for 60 seconds, then annealed at 130° C. on a hotplate for approximately 30 minutes. After annealing, 30 nm thick Au source and drain electrodes were deposited by thermal evaporation of Au at a rate of 2.5 Å/s. Next, 2 ml of 5 wt % PVP-co-PMMA with melamine (weight ratio of PVP-co-PMMA: melamine=10:1) solution in PGMEA solvent was spin cast onto the substrate at 1000 rpm for 60 seconds, placed on a hotplate at 120° C. for 2 minutes to remove solvent, and cured under UV light to cross-link the dielectric film 50 nm Au gate electrodes were then thermally deposited at 2.5 Å/s. The measured transfer curve of the device (FIG. 6) reveals a field-effect hole mobility of 0.02 $cm^2/V\cdot s$, an on/off ratio of 700, and a threshold voltage of −5 V.

We claim:

1. An article comprising:

a. a strengthened glass substrate having a first surface and a second surface and having a Vickers crack initiation threshold of at least [20] *7* kgf;

b. an organic semiconductor layer having a first surface and a second surface, wherein the first surface of the organic semiconductor layer is in direct contact with the second surface of the strengthened glass substrate;

c. a dielectric layer having a first surface and a second surface; and d. at least one [additional] electrode;

wherein the article does not contain a barrier layer between the organic semiconductor layer and the strengthened glass substrate;

wherein the strengthened glass comprises an ion-exchanged glass; and wherein the article comprises a top-gate thin film transistor, photovoltaic device, diode, or display device.

2. The article of claim 1, wherein said at least one electrode comprises a gate electrode, drain electrode, or a source electrode.

3. The article of claim 1, wherein the at least one electrode comprises a metal, conducting metal oxide film, conducting metal nanoparticulate ink, or conductive polymer.

4. The article of claim 1, wherein the organic semiconductor layer comprises a semiconducting small molecule, semiconducting oligomer, or semiconducting polymer.

5. The article of claim 4, wherein the semiconducting small molecule, semiconducting oligomer, or semiconducting polymer comprises a fused thiophene moiety.

6. The article of claim 1, wherein the dielectric layer comprises an organic or inorganic material that may be applied as a film at a temperature less than about 250° C.

7. The article of claim 1, further comprising a functional layer on the surface opposite of the organic semiconductor layer and dielectric layer of the strengthened glass substrate, wherein the functional layer is selected from an anti-glare layer, an anti-smudge layer, a self-cleaning layer, an anti-reflection layer, an anti-fingerprint layer, an optically scattering layer, an anti-splintering layer, and combinations thereof.

8. The article of claim 1, wherein the article comprises a top-gate top-contact or top-gate bottom-contact thin film transistor.

9. An article comprising:

a. a strengthened glass substrate having a first surface and a second surface and having a Vickers crack initiation threshold of at least [20] *7* kgf;

b. an organic semiconductor layer having a first surface and a second surface;

c. a dielectric layer having a first surface and a second surface wherein the first surface of the dielectric layer is in direct contact with the organic semiconductor layer;

d. a gate electrode in direct contact with the strengthened glass substrate and the second surface of the dielectric layer; and e. at least one additional electrode; wherein the article does not contain a barrier layer between the gate electrode and the strengthened glass substrate wherein the strengthened glass comprises an ion-exchanged glass; and wherein the article comprises a bottom-gate thin film transistor, photovoltaic device, diode, or display device.

10. The article of claim 9, wherein said at least one electrode comprises a drain electrode or a source electrode.

11. The article of claim 9, wherein the at least one electrode comprises a metal, conducting metal oxide film, conducting metal nanoparticulate ink, or conductive polymer.

12. The article of claim 9, wherein the organic semiconductor layer comprises a semiconducting small molecule, semiconducting oligomer, or semiconducting polymer.

13. The article of claim 12, wherein the semiconducting small molecule, semiconducting oligomer, or semiconducting polymer comprises a fused thiophene moiety.

14. The article of claim 9, wherein the dielectric layer comprises an organic or inorganic material that may be applied as a film at a temperature less than about 250° C.

15. The article of claim 9, further comprising a functional layer on the surface opposite of the organic semiconductor layer and dielectric layer of the strengthened glass substrate, wherein the functional layer is selected from an anti-glare layer, an anti-smudge layer, a self-cleaning layer, an anti-reflection layer, an anti-fingerprint layer, an optically scattering layer, an anti-splintering layer, and combinations thereof.

16. The article of claim 9, wherein the article comprises a bottom-gate top-contact or bottom-gate bottom-contact thin film transistor.

17. A method of forming the article of claim 1, comprising:

a. providing a strengthened glass substrate having a first surface and a second surface and having a Vickers crack initiation threshold of at least [20] *7* kgf;

b. providing an organic semiconductor layer;

c. providing a dielectric layer; and d. providing at least one electrode;

wherein the article does not contain a barrier layer.

18. The method of claim 17, wherein the providing an organic semiconductor layer comprises coating the strengthened glass substrate with the organic semiconductor layer and coating the organic semiconductor layer with the dielectric layer.

19. The method of claim 17, wherein the providing a dielectric layer step comprises coating the strengthened glass substrate with the dielectric layer and coating the dielectric layer with the organic semiconductor layer.

20. The method of claim 19, wherein coating comprises sputter coating, atomic layer deposition, ink jet printing, slot-die printing, dip coating, spin coating, Langmuir-Blodgett deposition, electrospray ionization, direct nanoparticle deposition, vapor deposition, chemical deposition, vacuum filtration, flame spray, electrospray, spray deposition, electrodeposition, screen printing, close space sublimation, nano-imprint lithography, in situ growth, microwave assisted chemical vapor deposition, laser ablation, arc discharge, gravure printing, doctor blading, spray-coating, slot die coating, or chemical etching.

21. A method of forming the article of claim 9, comprising: a. providing a strengthened glass substrate having a first surface and a second surface and having a Vickers crack initiation threshold of at least [20] *7* kgf; b. providing an organic semiconductor layer; c. providing a dielectric layer; and d. providing a gate electrode in contact with the strengthened glass substrate and the dielectric layer e. providing at least one additional electrode; wherein the article does not contain a barrier layer between the gate electrode and the strengthened glass substrate.

22. The method of claim [21] *17*, wherein the providing an organic semiconductor layer comprises coating the strengthened glass substrate with the organic semiconductor layer and coating the organic semiconductor layer with the dielectric layer.

23. The method of claim 21, wherein the providing a dielectric layer comprises coating the strengthened glass substrate with the dielectric layer and coating the dielectric layer with the organic semiconductor layer.

24. The method of claim 23, wherein coating comprises sputter coating, atomic layer deposition, ink jet printing, slot-die printing, dip coating, spin coating, Langmuir-Blodgett deposition, electrospray ionization, direct nanoparticle deposition, vapor deposition, chemical deposition, vacuum filtration, flame spray, electrospray, spray deposition, electrodeposition, screen printing, close space sublimation, nano-imprint lithography, in situ growth, microwave assisted chemical vapor deposition, laser ablation, arc discharge, gravure printing, doctor blading, spray-coating, slot die coating, or chemical etching.

* * * * *